(12) United States Patent  (10) Patent No.: US 8,583,289 B2
Stack et al.  (45) Date of Patent: Nov. 12, 2013

(54) CLIMATE CONTROL SYSTEM FOR DATA CENTERS

(75) Inventors: John F. Stack, Dublin, OH (US); Stephen A. Mowrer, Lewis Center, OH (US)

(73) Assignee: Liebert Corporation, Columbus, OH (US)

( * ) Notice: Subject to any disclaimer, the term of this patent is extended or adjusted under 35 U.S.C. 154(b) by 970 days.

(21) Appl. No.: 12/371,641

(22) Filed: Feb. 16, 2009

(65) Prior Publication Data

US 2009/0210096 A1  Aug. 20, 2009

Related U.S. Application Data

(60) Provisional application No. 61/066,311, filed on Feb. 19, 2008.

(51) Int. Cl.
*G05B 15/00*  (2006.01)

(52) U.S. Cl.
USPC ........... 700/278; 700/276; 454/184; 454/187; 236/49.4; 236/44 A; 361/679.47; 165/121; 165/67; 62/175

(58) Field of Classification Search
USPC .......... 700/276, 278; 454/184, 187; 236/49.4, 236/44 A; 361/679.47; 165/121, 67; 62/175
See application file for complete search history.

(56) References Cited

U.S. PATENT DOCUMENTS

| | | |
|---|---|---|
| 3,949,808 A | 4/1976 | Gilles |
| 3,979,922 A | 9/1976 | Shavit |
| 3,982,583 A | 9/1976 | Shavit |
| 4,044,947 A | 8/1977 | Spethmann |
| 4,086,781 A | 5/1978 | Brody et al. |
| 4,199,101 A | 4/1980 | Bramow et al. |
| 4,210,278 A | 7/1980 | Obler |
| 4,293,027 A | 10/1981 | Tepe et al. |
| 4,347,712 A | 9/1982 | Benton et al. |
| 4,362,026 A | 12/1982 | Miller |
| 4,437,608 A | 3/1984 | Smith |
| 4,485,632 A | 12/1984 | Gallagher |
| 4,495,986 A | 1/1985 | Clark et al. |
| 4,506,514 A | 3/1985 | Lamar et al. |
| 4,841,733 A | 6/1989 | Dussault et al. |
| 5,279,609 A | 1/1994 | Meckler |

(Continued)

OTHER PUBLICATIONS

Liebert Engineering White Paper "Utilizing Economizers Effectively in the Data Center" © 2003.

(Continued)

*Primary Examiner* — Tejal Gami
(74) *Attorney, Agent, or Firm* — Harness, Dickey & Pierce, P.L.C.

(57) ABSTRACT

A climate control system or a data center includes a computer room air conditioner (CRAC) and an air economizer. A control module determines whether outside air is suitable for use in cooling the data. If the outside air is suitable for use, outside air and not the CRAC is used to cool the data center when the dry bulb temperature of the outside air is below a minimum set point. The outside air is conditioned before it is introduced as supply air so that it is above a minimum temperature. If the outside air is suitable for use and the dry bulb temperature of the outside air is above the set point, the control module determines a cooling percentage of cooling of the data center to be provided by the CRAC and a cooling percentage to be provided by the outside air.

28 Claims, 10 Drawing Sheets

(56) References Cited

U.S. PATENT DOCUMENTS

| | | |
|---|---|---|
| 5,544,697 A | 8/1996 | Clark |
| 5,597,354 A | 1/1997 | Janu et al. |
| 5,769,314 A | 6/1998 | Drees et al. |
| 5,791,408 A | 8/1998 | Seem |
| 6,161,764 A | 12/2000 | Jatnieks |
| 6,176,436 B1 | 1/2001 | Gauthier et al. |
| 6,318,096 B1 | 11/2001 | Gross et al. |
| 6,415,617 B1 | 7/2002 | Seem |
| 6,481,635 B2 | 11/2002 | Riley et al. |
| 6,634,422 B2 | 10/2003 | Rayburn et al. |
| 6,749,125 B1 | 6/2004 | Carson et al. |
| 2005/0225936 A1* | 10/2005 | Day ................... 361/687 |
| 2006/0150644 A1* | 7/2006 | Wruck ................. 62/126 |
| 2006/0234621 A1* | 10/2006 | Desrochers et al. ...... 454/239 |
| 2008/0185446 A1* | 8/2008 | Tozer ................. 236/49.4 |

OTHER PUBLICATIONS

Liebert White Paper "Energy Efficient Cooling Solutions for Data Centers" © 2007.

* cited by examiner

CLIMATE CONTROL SYSTEM FOR DATA CENTERS

CROSS-REFERENCE TO RELATED APPLICATIONS

This application claims the benefit of U.S. Provisional Application No. 61/066,311 filed on Feb. 19, 2008. The entire disclosure of this provisional application is incorporated herein by reference.

FIELD

The present disclosure relates to data centers, and more particularly, to climate control systems for data centers.

BACKGROUND

The statements in this section merely provide background information related to the present disclosure and may not constitute prior art.

Rooms containing collections of electrical equipment such as computer servers may be referred to as data centers. Data centers and the equipment contained therein may operate optimally based on air with the appropriate temperature and humidity provided to the indoor environment. Maintaining the optimal environment for a data center often requires providing air at a temperature to remove heat from the data centers.

Devices sometimes known as "air economizers" have been used for space conditioning in conjunction with space conditioning systems that include air conditioning equipment. Space conditioning typically refers to conditioning space in buildings in areas occupied by humans, such as offices. The air economizer introduces outside air into the building to cool the space within the building such as when the temperature of the outside air is lower than the desired temperature in the building.

Electronic equipment in data centers is less tolerant to fluctuations in temperature and humidity than humans. As such, data centers are typically substantially sealed spaces that have vapor barriers where infiltration of air into the data center from outside the data center is minimized. Infiltration refers to air that enters the data center other than through a data center climate control system where it is first conditioned before being introduced into the data center. As such, air economizers are not typically used in conjunction with data center cooling systems. Rather, data centers cooling systems use air conditioned by air conditioning equipment where temperature and humidity are closely controlled to cool the data center. The general approach in data center cooling is to maintain a desired temperature and a desired humidity range while operating within a vapor barrier with less than 5% infiltration. ASHRAE specifies that the relative humidity level for Class 1 and Class 2 data centers be between forty and fifty-five percent.

FIG. 1 shows an example of a typical data center 100 having a climate control system 102. Data center 100 illustratively utilizes the "hot" and "cold" aisle approach where equipment racks 104 are arranged to create hot aisles 106 and cold aisles 108. Data center 100 is also illustratively a raised floor data center having a raised floor 110 above a sub-floor 112. The space between raised floor 110 and sub-floor 112 provides a supply air plenum 114 for conditioned supply air (sometimes referred to as "cold" air) flowing from computer room air conditioners ("CRACs") 116 of climate control system 102 up through raised floor 112 into data center 100. The conditioned supply air then flows into the fronts of equipment racks 104, through the equipment (not shown) mounted in the equipment racks where it cools the equipment, and the hot air is then exhausted out through the backs of equipment racks 104.

In the example data center 100 shown in FIG. 1, data center 100 has a dropped ceiling 118 where the space between dropped ceiling 118 and ceiling 120 provides a hot air plenum 122 into which the hot air exhausted from equipment racks 104 is drawn and through which the hot air flows back to CRACs 116.

CRACs 116 are coupled to a heat rejection device 124 that provides cooled liquid to CRACs 116. Heat rejection device 124 is a device that transfers heat from the return fluid from CRACs 116 to a cooler medium, such as outside ambient air. Heat rejection device 124 may include air or fluid cooled heat exchangers. Heat rejection device 124 may be a building chilled water system in which case chilled water is the cooled liquid provided to CRACs 116 and CRACs 116 may be chilled water air conditioning systems having chilled water valves. The chilled water valves may be on/off valves or be variable valves, such as capacity modulated valves. Heat rejection device 124 may also be a refrigeration condenser system, in which case a cooled refrigerant is provided to CRACs 116 and CRACs 116 may be phase change refrigerant air conditioning systems having refrigerant compressors. The chilled water valves and compressors of CRACs 116, as applicable, are indicated representatively by dashed box 117 in FIG. 1 and the solid box 117 in FIGS. 2A & 2B.

Each CRAC 116 may include a control module 125 that controls the CRAC 116.

It should be understood that data center 100 can include a plurality of climate control systems 102, each having one or more CRACs 116. In this regard, CRACs 116 shown in FIG. 1 may be part of the same climate control system 102, or may be part of separate climate control systems 102.

SUMMARY

This section provides a general summary of the disclosure, and is not a comprehensive disclosure of its full scope or all of its features. A data center has equipment racks in which electronic equipment is disposed and a climate control system that includes a computer room air conditioner (CRAC) and an air economizer. The climate control system includes a control module that controls the climate control system. A dry bulb temperature of outside air and a parameter indicative of humidity of outside air are measured, such as via one or more sensors, and stored in the control module. A return air damper and an outside air damper are controlled with the control module. The control module determines whether outside air is suitable for use in cooling the data center based on the dry bulb temperature and humidity of the outside air. If the control module determines that outside air is not suitable for use in cooling the data center, only the CRAC is used to cool the data center. When the control module determines that outside air is suitable for use in cooling the data center, the control module determines to use outside air and not the CRAC to cool the data center when the dry bulb temperature of the outside air is below a minimum outside air dry bulb temperature set point. The control module then controls the climate control system to condition the outside air before it is introduced as supply air into the data center so that the supply air is above a minimum temperature. When the control module determines that outside air is suitable for use in cooling the data center and the dry bulb temperature of the outside air is above the minimum outside air dry bulb temperature set point, the control module determines a cooling percentage of cooling of the data center to be provided by the CRAC and a cooling percentage to be provided by the outside air, where the percentage can range from zero percent to one-hundred percent. The control module then controls the climate control system so that the CRAC and outside air provide cooling of the data center according to their respective determined cooling percentages.

In an aspect, when outside air is being used to cool the data center, humidity control of the climate control system is shut off.

In an aspect, when the outside air temperature is below the minimum outside air dry bulb temperature setpoint, the return air and outside air dampers are controlled to mix room return air with outside air so that the supply air is above the minimum.

In an aspect, the control module determines that the outside air is suitable for use in cooling the data center when the humidity of the outside air is above a minimum humidity and the dry bulb temperature of the outside air is below the maximum outside air temperature set point.

In an aspect, the control module determines that the outside air is above the minimum humidity when a wet bulb temperature of the outside air is above a minimum outside air wet bulb temperature set point.

In an aspect, in the control module determines a heat load of the data center and determines the cooling percentages based on the heat load.

In an aspect, the control module determines a rate at which to run an air moving unit of the climate control system based on the heat load of the data center.

In an aspect, the control module determines to run the air moving unit at a high air flow rate if the heat load is high, a moderate air flow rate if the heat load is moderate, and a low air flow rate if the heat load is low.

In an aspect, the control module determines the cooling percentages of the CRAC and outside air to maximize the cooling percentage of the outside air and minimize the cooling percentage of the CRAC and operates a heat rejection device at a load corresponding to the cooling percentage of the CRAC.

In an aspect, the control module activates an alarm when the control module determines that either the return air damper or outside air damper is not operating properly.

In an aspect, the control module measures via a sensor a dry bulb temperature of room return air and determines that the outside air is suitable for use in cooling the data center when the dry bulb temperature of the outside air is less than the dry bulb temperature of the room return air.

In an aspect, the data center includes a plurality of climate control systems and the control modules of each of the climate control systems are teamed and each climate control module takes into account how each other climate control system is being controlled in determining how to control its climate control system.

In an aspect, the climate control system includes a fluid economizer having a cooling coil disposed in the computer room air conditioner. The control module stages the air economizer, fluid economizer and computer room air conditioner in the order of the air economizer, fluid economizer and computer room air conditioner.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DESCRIPTION

The following description is merely exemplary in nature and is not intended to limit the present disclosure, application, or uses.

As used herein, the term control module refers to an electronic device that can be configured to control other devices. By way of example and not of limitation, a control module can include one or more of an application specific integrated circuit (ASIC), an electronic circuit, a processor (shared, dedicated or group) and memory that execute one or more software or firmware programs, a programmable control system, a process control system, a combinational logic circuit, or other suitable components that provide the described functionality.

In accordance with an aspect of the present disclosure, a plurality of air supply sources or cooling technologies may be utilized to provide an appropriate environment for the operation of a data center. In an aspect, the temperature (dry-bulb and dew point) of the supply air (conditioned air provided by the climate control system) is optimized by the use of outside air. It may be desired to maintain a particular dry bulb (db) temperature range which may be selected by the user. For example, under the teachings of the present disclosure, cooling systems or sources can be combined and controlled using a control module. By way of example and not of limitation, such cooling systems or sources include outdoor air, variable capacity compressors, chilled water, variable speed motors, electronic expansion valves, air economizers and fluid economizers.

Figure 1:
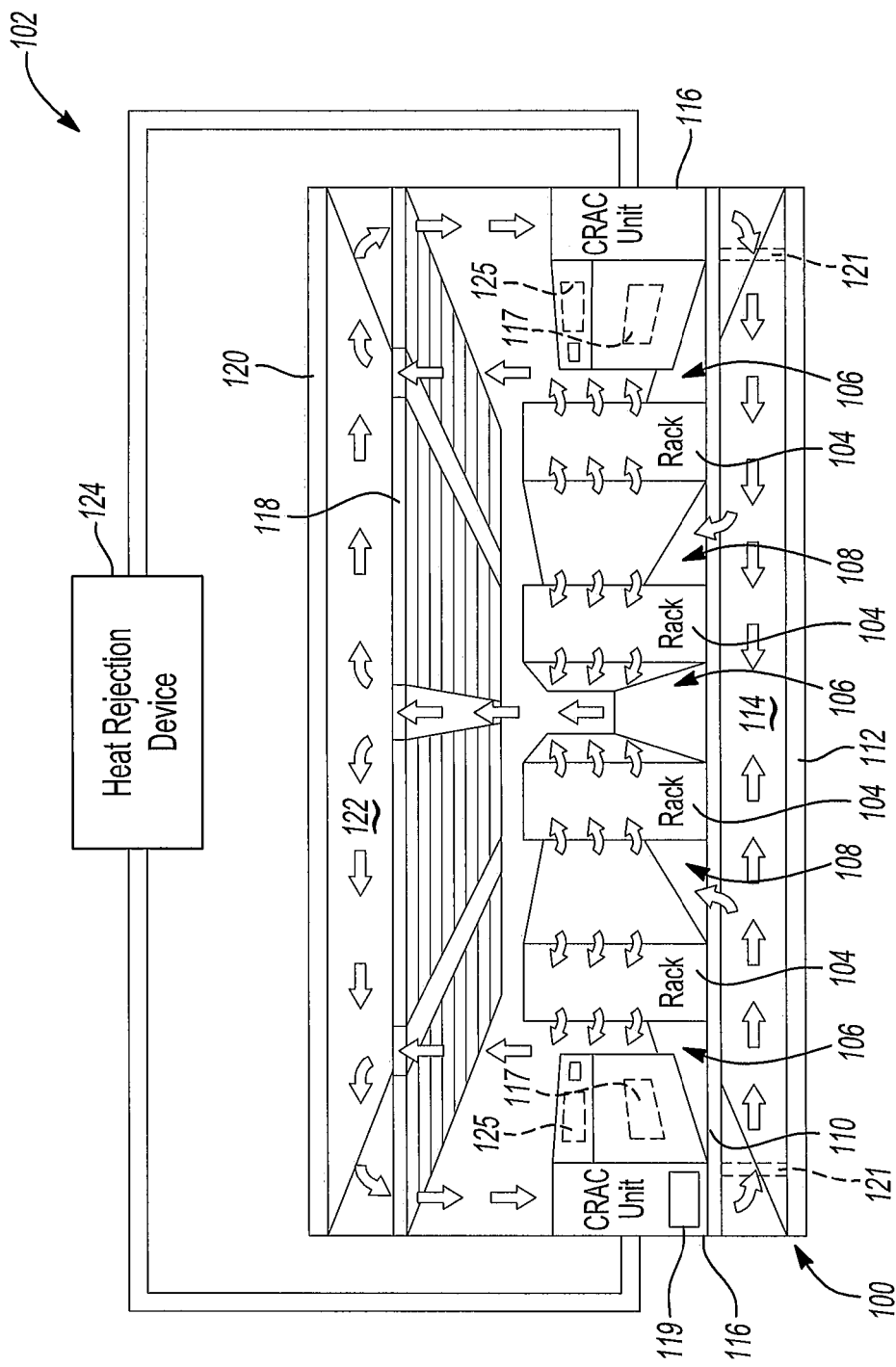
FIG. 1 is a schematic illustrating a prior art data center.
Figure 2A:
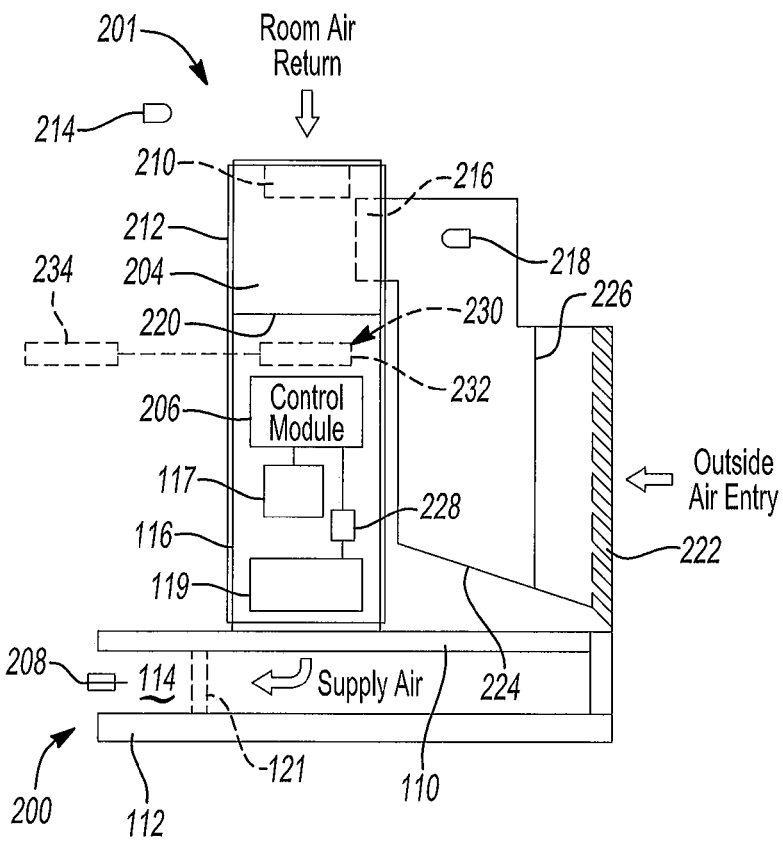
FIGS. 2A and 2B are schematics illustrating a data center having climate control systems in accordance with an aspect of the present disclosure.
Figure 2B:
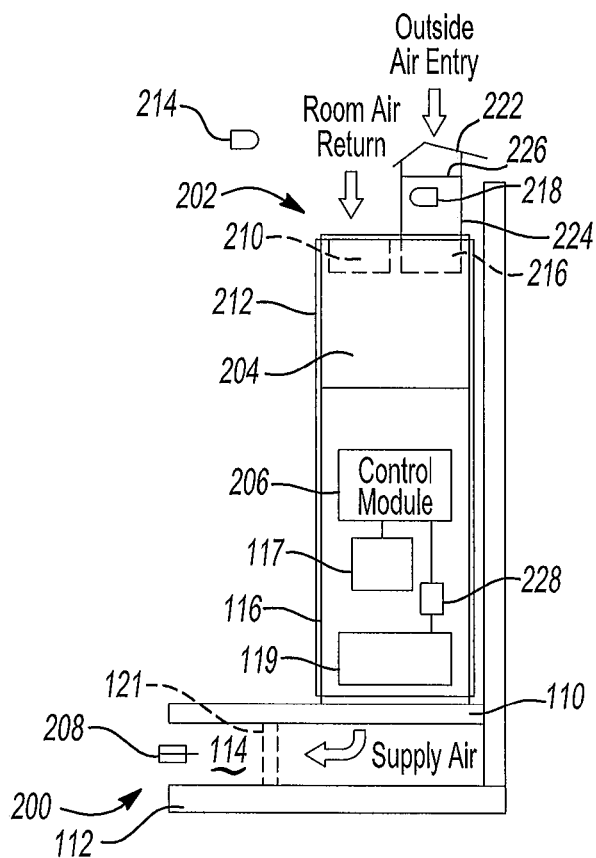

In an illustrative aspect of the present disclosure, FIGS. 2A and 2B depict climate control systems 201 (FIG. 2A), 202 (FIG. 2B) for a data center 200 that combines an air economizer 204 with a cooling unit, such as a CRAC 116. Air economizer 204 provides for the use of outside air in cooling data center 100 under appropriate conditions, as described below. Climate control systems 201, 202 output supply air to the data center. This air may or may not be temperature and humidity conditioned depending on the use of air economizer 204 as described below. Each such climate control system 201, 202 may include a control module 206 capable of controlling the climate control system related equipment. Supply air sensor 208 senses the temperature and in an aspect, may also sense the humidity of the supply air that the climate control systems 201, 204 output into the data center 200. Supply air sensor 208 may illustratively be located in plenum 114 under raised floor 110 of the data center 100 (where the climate control system supplies the supply air into plenum 114, in an outlet duct, or in a cold aisle.

An air return from the data center may be provided at a return air damper 210 of an air economizer plenum 212 of air economizer 204 of the climate control system 201, 202. In this regard, the air economizer plenum 212, associated control module and sensors can be retrofitted to an existing climate control system having a cooling unit, or can be incorporated with a cooling unit in a climate control system. The control of climate control system 201, 202 having CRACs 116 with air economizers 204 may illustratively be provided by control module 206. Return air damper 210 may be mechanically or electrically controlled by control module 206 to selectively allow air that has circulated through the data center to enter the air economizer plenum 212 to provide air to CRAC 116 of the climate control system 201, 202. In this regard, return air damper 210 may illustratively be a motorized damper. Return air damper 210 may be selectively opened or closed, or preferably regulated to a desired position ranging from full open to full closed as described in more detail below. Return air sensor 214 may be located at or near return air damper 210 to sense the temperature and humidity of the return air at return air damper 210.

The air economizer plenum 212 may also include an outside air damper 216 that selectively allows outdoor air to enter the air economizer plenum 212 of the climate control system 201, 202 from an outside air inlet 222 coupled to outside air damper 216 by a duct 224. A filter 226 may provided in duct 224. Outside air damper 216 may be mechanically or electrically controlled by control module 206 to selectively allow outdoor air to enter the air economizer plenum 212. In this regard, return air damper 210 may illustratively be a motorized damper. Outside air damper 216 may be selectively opened or closed, or preferably regulated to a desired position ranging from full open to full closed, as described in more detail below. Outside air sensor 218 may be located at outside air damper 216 to sense the temperature and humidity of the outside air at or near outside air damper 216. Outside air damper 216 may be fitted with guards or other fixtures (not shown) to prevent the entry of physical items from outdoors into the air economizer plenum 212.

It should be understood that sensors 208, 214, 218 are any type of sensor that sense dry bulb temperature and a parameter indicative of humidity, such as humidity or wet bulb temperature as appropriate. Each sensor may be a combined sensor that senses both dry bulb temperature and the parameter indicative of humidity, or may include separate sensors, one that senses dry bulb temperature and one that senses the parameter indicative of humidity. By way of example and not of limitation, supply air sensor 208 may be a thermistor (such as where sensor 208 does not sense the parameter indicative of humidity). Supply air sensor 208 may illustratively be a sensor having part number 148039P1, return air sensor 214 may illustratively be a sensor having part number 181464G1, and outside air sensor 218 may illustratively be a sensor having part number 181465G1, each available from Liebert Corporation of Columbus, Ohio.

The air economizer plenum 212 illustratively provides a source of air for CRAC 116 of the climate control system 201, 202. A filter 220 may be included between the air economizer plenum 212 and CRAC 116. The air provided to the air economizer plenum may be controlled by regulating the positions of return air damper 210 and outside air damper 216, which may be controlled by outputs of the control module 206. The positions of return air damper 210 and outside air damper 216 may be controlled based on temperature and humidity readings from sensors 208, 210 and 216, which in turn may be provided to the control module 206. In an aspect, the positions of return air damper 210 and outside air damper 216 may be controlled by control module 206 based on an emergency condition wherein CRAC 116 fails to operate properly. In this emergency mode, it may be desired to open outside air damper 216 as long as the outdoor dry bulb temperature (sensed by outside air sensor 218) is less than the return air dry bulb temperature (sensed by return air sensor 214).

In an aspect, CRAC 116 includes a variable compressor. In an aspect, CRAC 116 includes a capacity modulated compressor type of compressor or a 4-step semi-hermetic compressor, such as those available from Emerson Climate Technologies or Liebert Corporation. Climate control systems 202, 202 may also include one or more air moving units 119, such as fans or blowers. The air moving units 119 may be provided in CRACs 116 or may additionally or alternatively be provided in supply air plenum 114 as shown in phantom at 121. Air moving units 119, 121 may illustratively have variable speed drives, shown at 228 for air moving unit 119.

In an aspect, CRAC 116 may include a fluid economizer 230 shown in phantom in FIG. 2A. Fluid economizer 230 includes a fluid cooling coil 232 disposed in CRAC 116 coupled to a dry cooler 234.

Control of a data center cooling system requires modification when including an air economizer compared to a data center cooling system that does not utilize an air economizer. The key element of operation with an air economizer is an expected significant savings in power based on reduced operation of compressors for compressor or chilled fluid cooling and motors for air movement. The control of the data center cooling system having an air economizer must stage the appropriate system components, e.g., compressors and/or valves, air movers, the air economizer, fluid economizer (if present), etc, to provide effective cooling while protecting critical computing loads and the air conditioning unit(s) itself.

Therefore, a basic decision must be made to activate or deactivate the air economizer so energy savings can be realized in favorable environments and undesirable data room air conditions can be avoided. The switchover must occur with suitable hysteresis to avoid frequent cycling. Also, for many applications, the amount of airflow is significant. This requires opening relatively large dampers for intake of outside air and applying nearly equivalent exhaust air devices to enable required air flow into and out of the data room.

The outdoor ambient air provides the basic function to drive unit control settings for rejecting heat either via air or fluid cooled heat exchangers. It also is used to indicate the potential for direct application of outdoor air for cooling by the air economizer. Additionally, the conditioning load and status of each cooling unit of the data center (either assigned for conditioning or standby modes of operation within a group) are used to select operating levels of air moving and primary cooling devices.

The outdoor ambient air conditions of temperature and moisture content (humidity) are measured to evaluate the suitability of direct use of the outside ambient air for cooling.

These conditions may be tracked over time to estimate recurring patterns in a Fuzzy logic mode. The program logic is adjusted to recognize the loss of humidity control whenever dampers of the air economizer are open to the outdoor environment. The basic moisture content of the outdoor ambient air will overpower the data center air conditioning system and set the moisture levels inside the data center. This operation is fundamentally different from the general approach in data center cooling discussed above of maintaining a relatively narrow desired humidity range while operating within a vapor barrier with less than 5% infiltration.

Additionally, decisions must be made to set the levels of output of each variable energy consuming device (e.g., compressors, chilled water valves and air moving devices). These devices may be multiple per unit and the site may have multiple units serving the total load. Therefore, a basic assessment of the total heat load requirement of the data center must be made to effectively set the cooling level of each device used in the cooling of the data center. Direct measurements of data center power consumption may be an input to the control, or monitoring the cooling output within the unit control may be used to determine this heat load. As the heat load is determined, hierarchical decisions for airflow, number of compressors, operating points for variable mass flow compressors and valve positions for variable temperature cooling fluids can be made. These decisions are dynamic to adjust for changes within the load profile.

Figure 3:
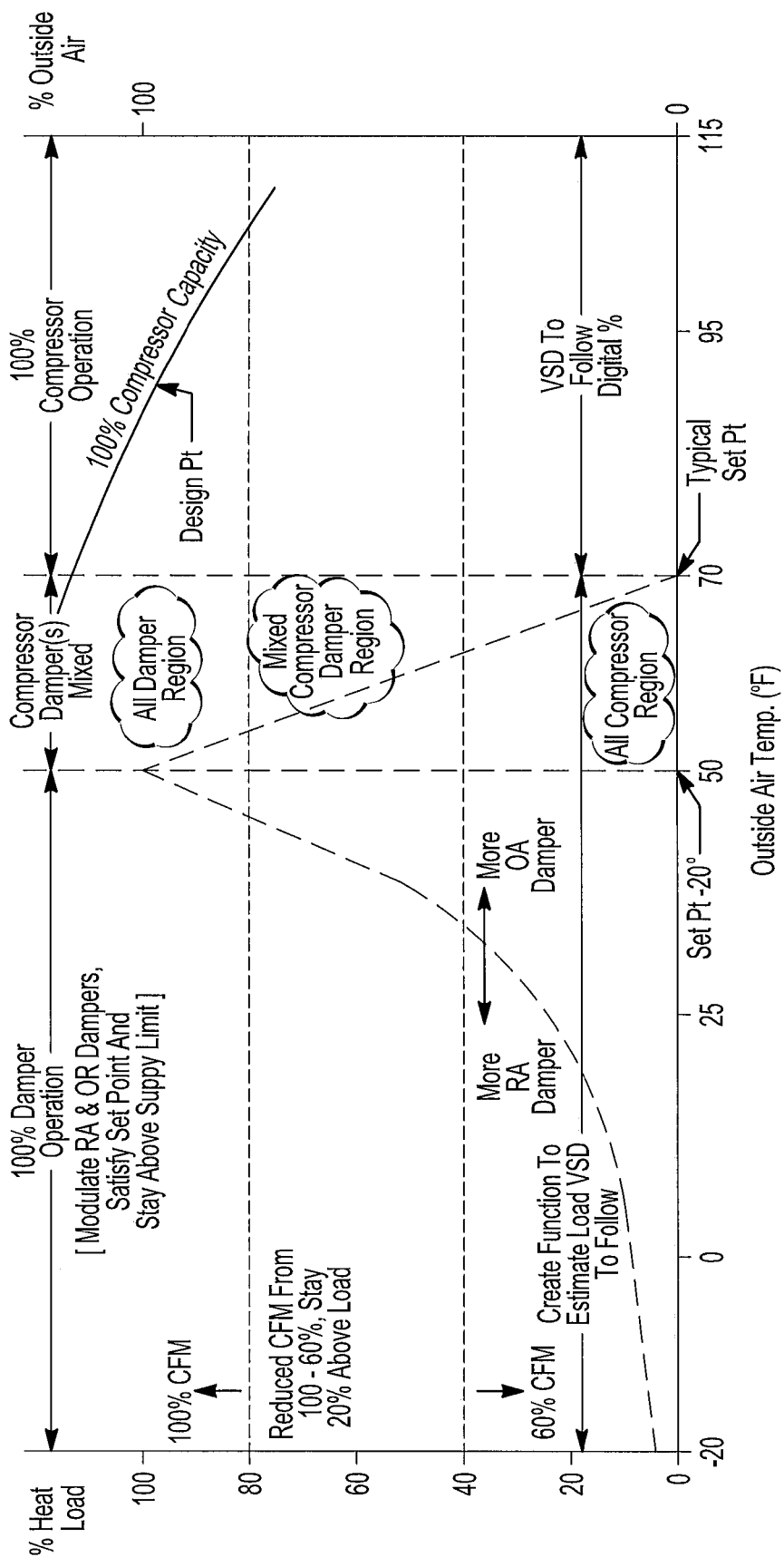
FIG. 3 is chart illustrating operation of the climate control systems of FIGS. 2A and 2B.
Figure 4A:
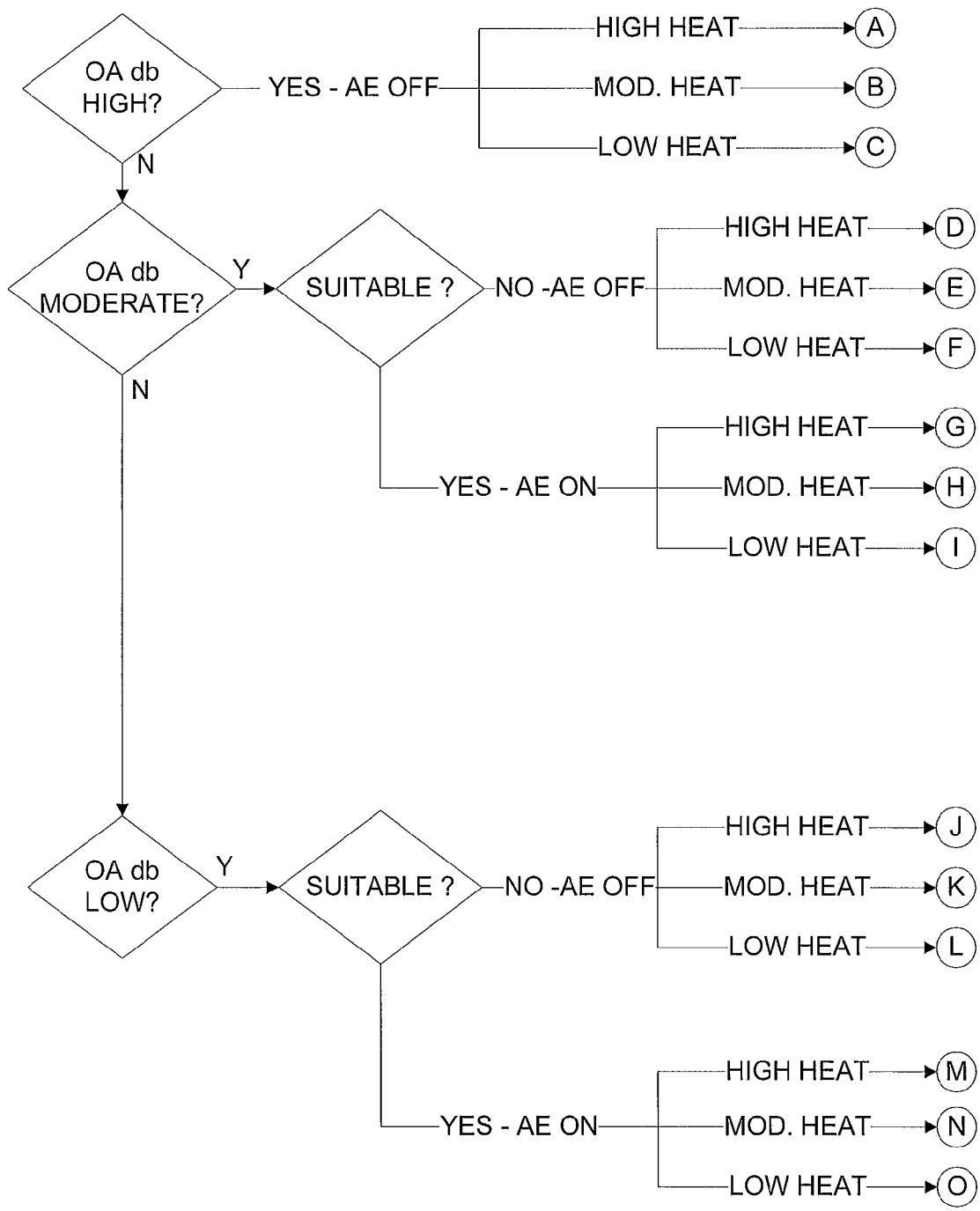
FIGS. 4A-4C are flow charts illustrating a control of the climate control systems of FIGS. 2A & B in accordance with the chart of FIG. 3.
Figure 4B:
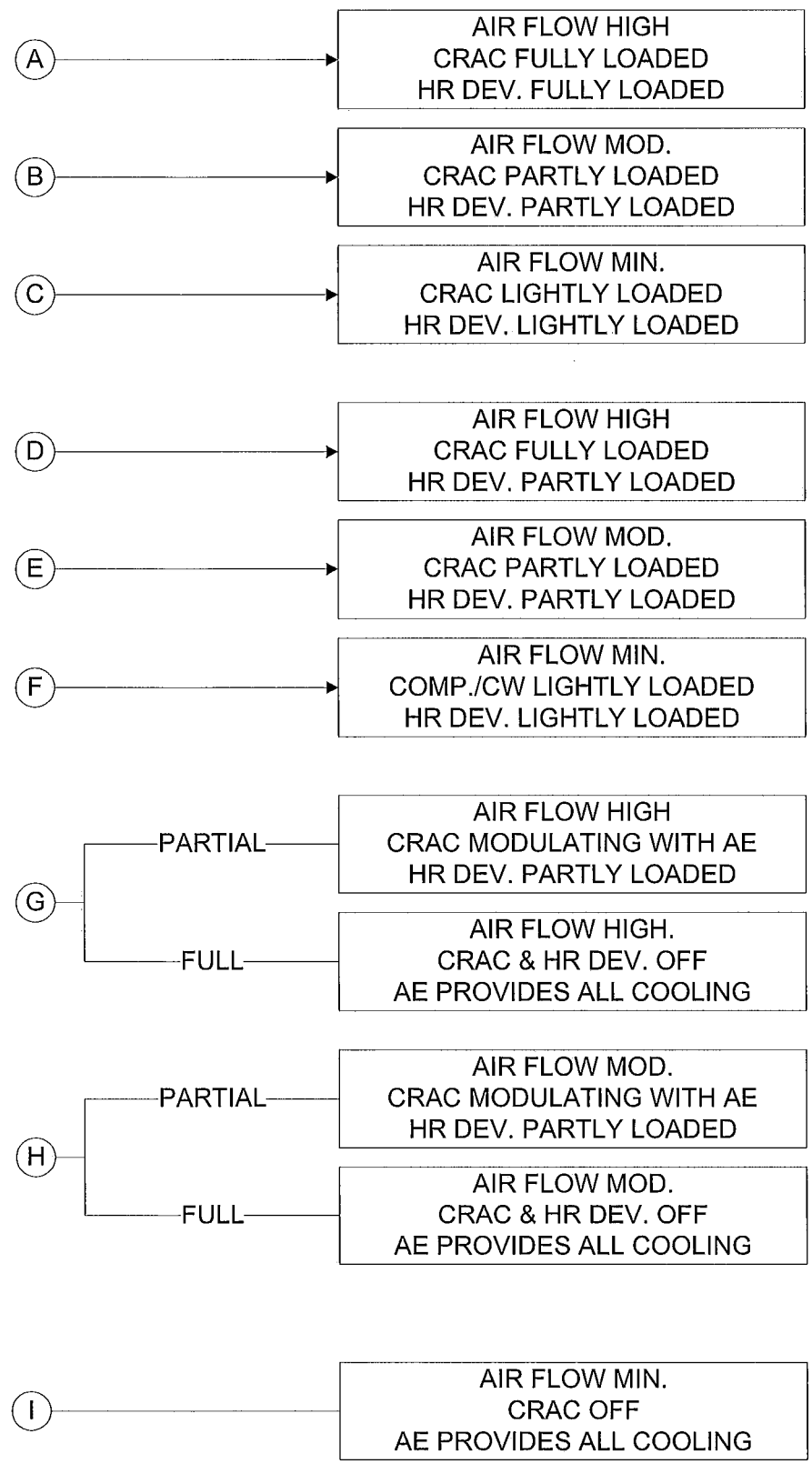
Figure 4C:
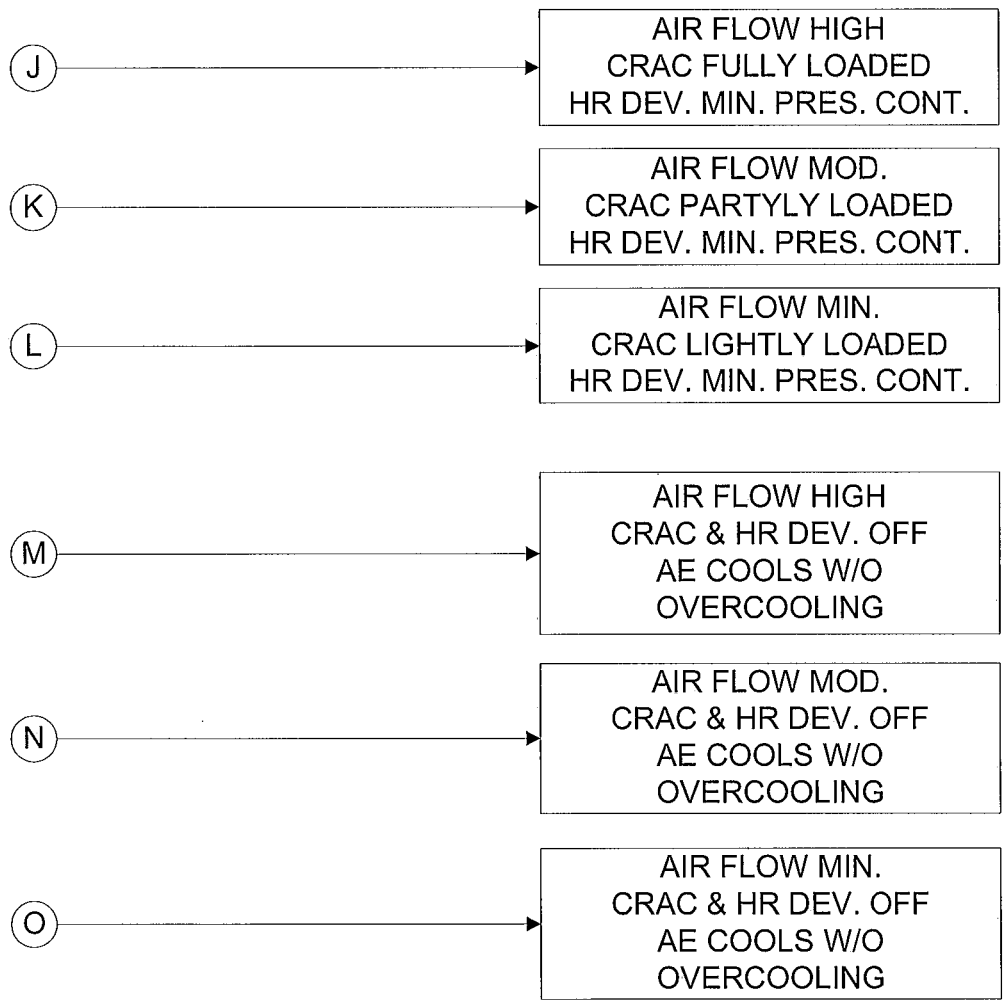

FIG. 3 is a chart illustrating the operation of the above described data center climate control systems 201, 204 at various outdoor ambient air (OA) conditions at various data center heat loads, including variable speed drive considerations of the air mover(s) of climate control systems 201, 202 and capacity modulated compressor type of compressor considerations and/or capacity modulated chilled water ("CW") valve considerations. With reference to the chart of FIG. 3 and the flow chart of FIGS. 4A-C, examples of operation at various data center heat loads and outdoor ambient air conditions are as follows:

1) High heat load/high OA—airflow high/CRAC (compressors or CW valves of CRAC) fully loaded/air economizer closed/heat rejection device fully loaded (as shown by branch A in FIGS. 4A & B).

2) Moderate heat load/high OA—airflow moderate/CRAC partly loaded/air economizer closed/heat rejection device partly loaded (as shown by branch B in FIGS. 4A & B).

3) Low heat load/high OA—airflow minimal/CRAC lightly loaded/air economizer closed/heat rejection device lightly loaded (as shown by branch C in FIGS. 4A & B).

4) High heat load/moderate OA—airflow high/CRAC fully loaded/air economizer closed/heat rejection device partly loaded (as shown by branch D in FIGS. 4A & B); or, if outdoor air is suitable for partial cooling (outdoor enthalpy lower than indoor enthalpy or outdoor humidity acceptable), airflow high/CRAC modulating with air economizer/heat rejection device partly loaded (as shown by branch G—Partial in FIGS. 4A & B); or, if outdoor air is suitable for full cooling, airflow high/CRAC off/air economizer provides all cooling/heat rejection device off; (as shown by branch G'Full in FIGS. 4A & B).

5) Moderate heat load/moderate OA—airflow moderate/CRAC partly loaded/air economizer closed/heat rejection device partly loaded (as shown by branch E in FIGS. 4A & B); or, if outdoor air is suitable for partial cooling, airflow moderate/CRAC modulating with air economizer/heat rejection device partly loaded (as shown by branch H—Partial in FIGS. 4A & B); or, if outdoor air is suitable for full cooling, airflow moderate/CRAC off/air economizer provides all cooling/heat rejection device off; (as shown by branch H—Full in FIGS. 4A & B).

6) Low heat load/moderate OA—airflow minimal/CRAC lightly loaded/air economizer closed/heat rejection device lightly loaded (as shown by branch F in FIGS. 4A & B); or, if outdoor air is suitable for cooling, airflow minimal/CRAC off/air economizer provides all cooling/heat rejection device off; (as shown by branch I in FIGS. 4A & B).

7) High heat load/low OA/—airflow high/CRAC fully loaded/air economizer closed/heat rejection device in minimum pressure control (as shown by branch J in FIGS. 4A & C); or, if outdoor air is suitable for cooling, airflow high/CRAC off/air economizer cools without over-cooling/heat rejection device off (as shown by branch M in FIGS. 4A & C).

8) Moderate heat load/low OA/—airflow moderate/CRAC partly loaded/air economizer closed/heat rejection device in minimum pressure control (as shown by branch K in FIGS. 4A & C); or, if outdoor air is suitable for cooling, airflow moderate/CRAC off/air economizer cools without over-cooling/heat rejection device off (as shown by branch N in FIGS. 4A & C).

9) Low heat load/low OA—airflow minimal/CRAC lightly loaded/air economizer closed/heat rejection device in minimum pressure control (as shown by branch L in FIGS. 4A & C); or, if outdoor air is suitable for cooling, airflow minimal/CRAC off/air economizer provides all cooling without over-cooling/heat rejection device off (as shown by branch O in FIGS. 4A & C).

Load estimations for the variable speed drive of air moving unit 119, 121 may be as follows:

100% Damper Operation:
Capacity (load)=1.08×CFM×ΔT between OA and RA OA & Return Air (RA) CFM=f(damper positions)
$T_{mixed\ air} = T_{RA}$ (% damper)+$T_{OA}$ (% damper) (where $T_{RA}$ is the temperature of the return air and $T_{OA}$ is the temperature of the outside air)

100% Compressor (or CW) Operation:
Capacity (load)=Dig. % (unit rating) (where Dig. % (unit rating) is the on % of the compressor)
Also or alternatively, the penetration of the proportional band is monitored for cooling requirements and also used to determine the load requirement.

Dampers/Compressor (or CW) Operation
Capacity (load)=(Dampers+Compressor %) unit rating Besides the unique combination of individual control device positions based on heat load and outdoor air ambient conditions, the data center control module applies a variety of safety operations to prevent overcooling the data center heat loads (for example, the electronic equipment in equipment racks in the data center) or allowing the climate control system to operate outside of preset boundaries.

Additionally, the use of the air economizer may be overridden for a variety of user reasons. Therefore, an accessible switch is available to prevent air economizer operation when issues such as air contaminants become unacceptable or secondary equipment is not functional.

An important aspect of the control implemented in control module 206 of the climate control systems 201, 202 is the capability to allow the user to make compromise decisions between energy savings and projected life of the electronic equipment that operates within the operation of the data center climate control system. Operation with an air economizer offers a significant energy savings, but it is subject to the ambient humidity levels. Frequent swings in humidity may reduce the useful life of some electronic devices. As those levels of life vs. humidity swings and cost of electricity are evaluated by data center operators, adjustments can be applied to the control to limit or expand the air economizer function.

Airflow is the rate of flow of the supply air moved by the air movers (such as fans) of the data center climate control system to introduce the supply air into the data center. High, moderate and low ambient outside air may be preset parameters or may be user settable parameters. By way of example and not of limitation, if the desired temperature in the data center is 74 degrees Fahrenheit, high ambient outdoor air is when the dry bulb temperature of the ambient outside air is 90 degrees Fahrenheit or above, moderate ambient outdoor air is when the dry bulb temperature of the outdoor ambient air is the range of 50 to 70 degrees Fahrenheit, and low outdoor ambient air is when the dry bulb temperature of the outdoor ambient air is 40 degrees Fahrenheit or less. Also by way of example and not of limitation, in addition to being below the high dry bulb temperature set point, the humidity of the ambient outside air must be within an acceptable range, such as again by the way of example and not of limitation, having a dew point in the range of db 68° F./relative humidity 40% (dp=44° F.) to db 77° F./55% relative humidity (dp=60° F.). When the air economizer is closed, its outside air damper 216 to outside air is closed so that no outside air flows through the air economizer into the data center.

In the aspect where CRAC includes fluid economizer 230, control module 206 includes fluid economizer 230 in the staging of the various cooling devices. By way of example and not of limitation, control module 206 stages the cooling devices in the order of air economizer 204 (assuming outside ambient air is suitable for use), fluid economizer 230 and the compressor/CW valves. That is, if outside ambient air is suitable for cooling the data center and is adequate to provide all the cooling, then only air economizer 204 is used to cool the data center. If the outside air is not adequate to provide all the cooling, then the fluid economizer 230 is added to the mix, with by way of example and not of limitation, the use of outside air maximized and the use of fluid economizer minimized. If the combination of outside ambient air the fluid economizer 230 does not provide adequate cooling, then the compressors/CW valves of CRAC 116 are added to the mix, with by way of example and not of limitation, the use of outside air maximized, the use of fluid economizer 230 maximized to the extent needed to supplement the outside air, and the use of use of the compressors/CW valves of CRAC 116 minimized.

The control module 206 of data center climate control system 201, 206 may compare the measured values to predetermined or adjustable setpoints. The following are variables and or setpoints that may be utilized by the control module 206:

P1=db (dry bulb) temperature set point @ sensor 208 (supply air); default=60° F.; minimum=50° F.

P2=dew point (dp) temperature (i.e., wet bulb temperature) minimum setpoint; default=68/40%=44° F.

P3=dp temperature maximum setpoint; default=75/55%=57.5° F.; maximum=77/55%=60° F.

P4=parameter to adjust the alarm sensitivity of alarm 2, discussed in more detail below.

P5=parameter to adjust the alarm sensitivity of alarm 3, discussed in more detail below.

FC=the percentage of cooling provided by outdoor air, i.e., "free cooling."

It should be understood that these variables or set points can be preset. They can also be user programmable so that the control is adaptive and allows for changing the way in which the climate control system is controlled over the life of the data center.

Figure 5:
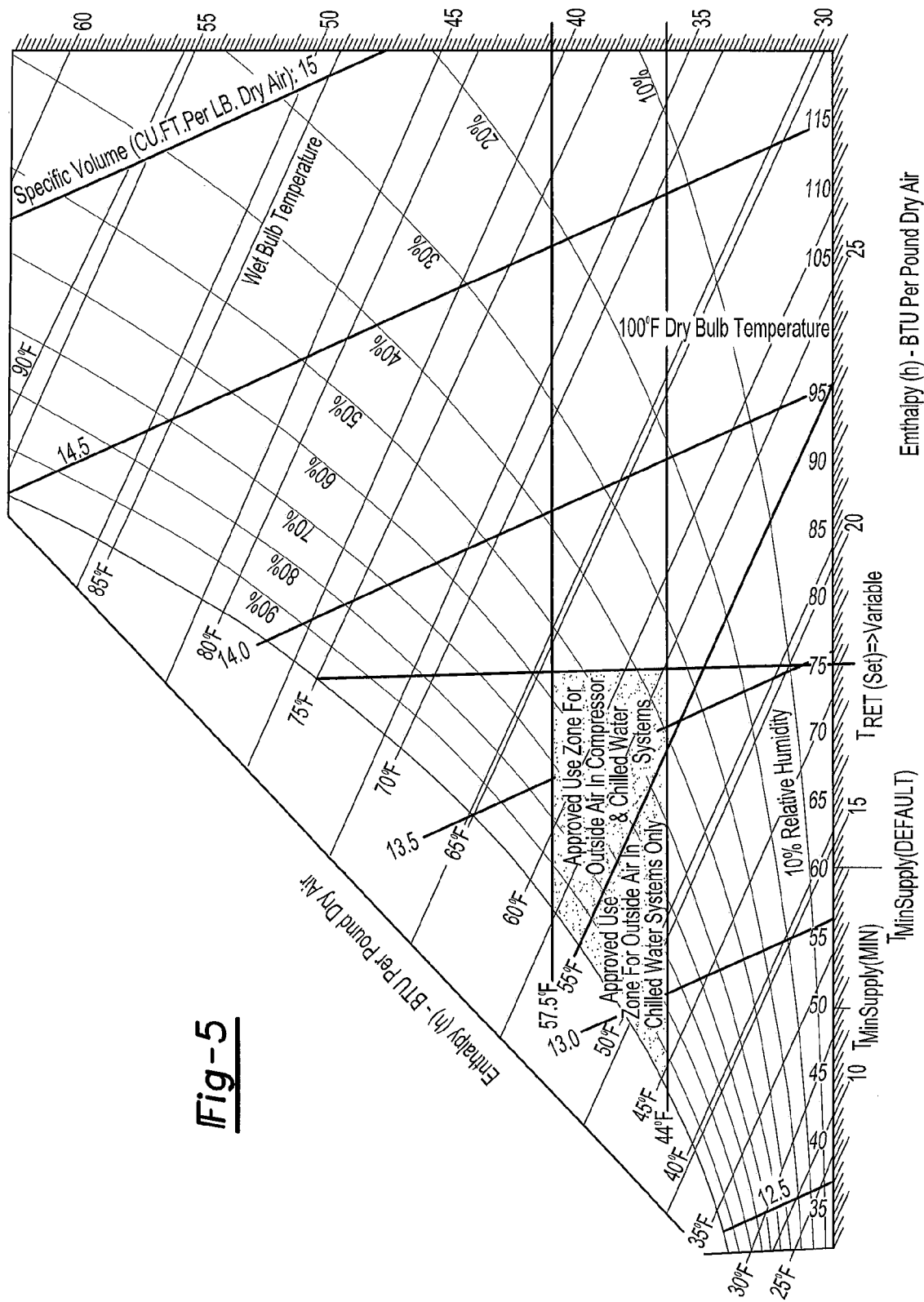
FIG. 5 is a psychometric chart showing illustrative operational modes of the climate control systems of FIGS. 2A and 2B.
Figure 6:
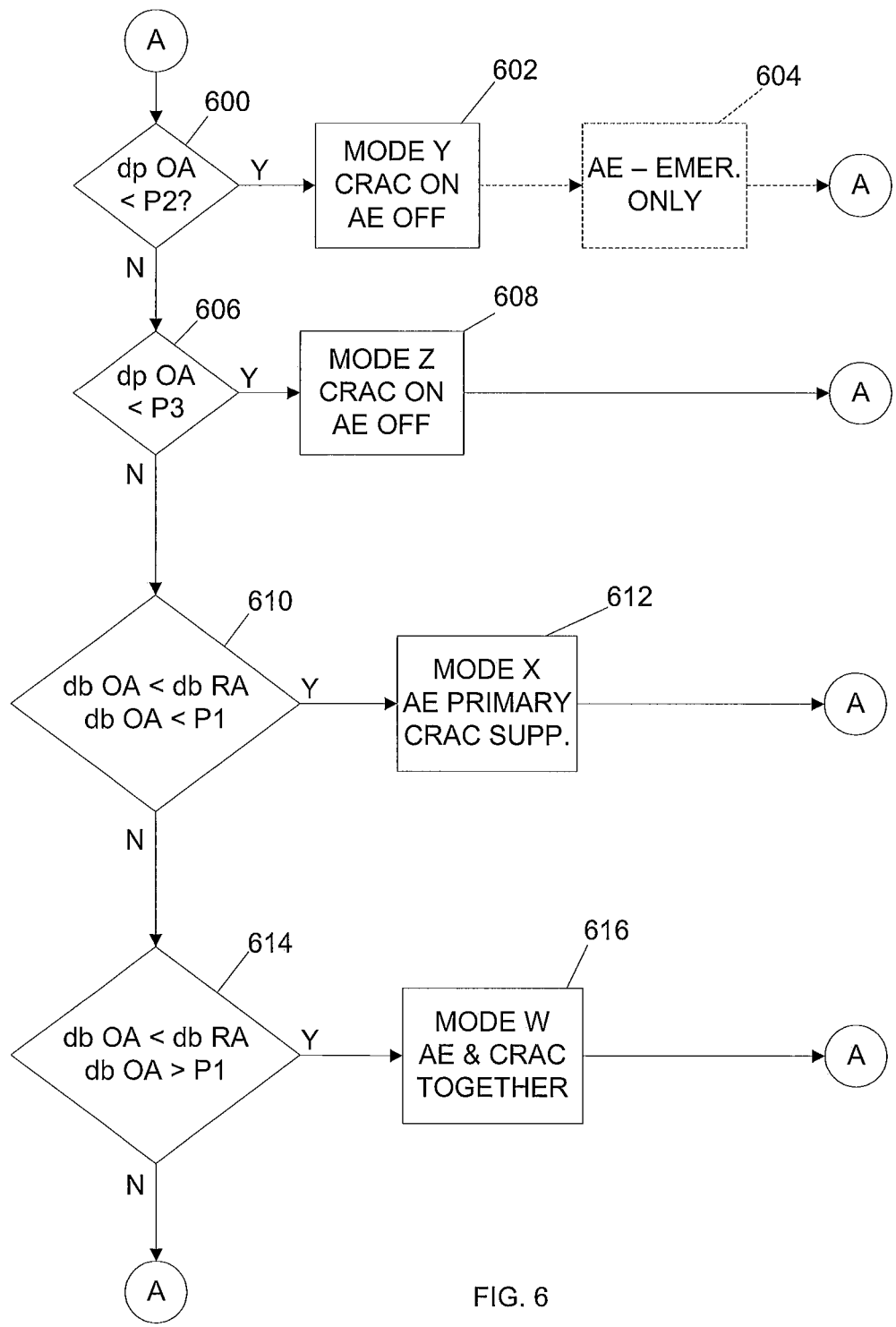
FIG. 6 is a flow chart illustrating a control of the climate control systems of FIGS. 2A and 2B according to the chart of FIG. 5.

FIG. 5 is a psychometric chart including various modes that may be employed based on the climate control system operating conditions and measured parameters. FIG. 6 is a flow chart showing four example control modes for the climate control systems 201, 202. The control modes may illustratively be implemented by control module 206 programmed with software to execute the control modes.

With reference to FIG. 6, if at 600 control module 206 determines that the dew point of the outside ambient air at sensor 218 (dp OA)<P2, then control module 206 is in Mode Y at 602 where it has outside air damper 216 fully closed. Using the parameters provided above, this means that Mode Y is utilized when the dew point temperature at outside air sensor 218 is less than the dew point temperature set point P2. In mode Y, outside air damper 216 is closed. All of the cooling is provided by CRAC(s) 216 of the climate control systems 201, 202 and the free cooling is at 0%. As used herein, "free cooling" means the cooling from the outside ambient air obtained via air economizer 204. Humidifier control functions may also be performed in Mode Y. However, if the climate control system 201, 202 would otherwise be in Mode Y and an emergency mode condition is encountered, the outside air damper 216 may be opened to allow outdoor air to assist in cooling the data center 200, as shown in phantom at 604.

If at 606 control module 206 determines that the dew point of the outside air (dp OA)>P3, then control module 206 is in Mode Z at 608 where it has outside air damper 216 fully closed and free cooling is at 0%: In this case, the dew point temperature of the outside ambient air is greater than the maximum dew point setpoint, and outside ambient air is not used to cool the data center 200.

If at 610 control module determines that the dry bulb temperature of the outside ambient air (db OA) is less than the dry bulb temperature of the room return air at return air sensor 214 (db RA) and db OA<P1, control module 206 is in Mode X at 612 where outside air damper 216 of air economizer 204 is open and the outside air provided by air economizer 204 provides the principal source of cooling air to data center 200. CRACs 116 only provide cooling as needed to assist the outdoor air. In this case, the dry bulb temperature of the outside ambient air is less than the room return air dry bulb temperature and the dry bulb temperature set point. The return air damper 210 and the outside air damper 216 are regulated to obtain the appropriate mix of room return air and outdoor air. In this mode the free cooling may be up to 100% depending on whether db OA is low enough to satisfy the full cooling load of data center 200. To the extent that the full cooling load cannot be controlled by regulating return air damper 210 and outside air damper 216, CRACs 116 are illustratively used to assist with cooling the data center 200 such that FC<100%.

If at 614, control module 206 determines that the dry bulb temperature of the outside ambient air (db OA) is less than the dry bulb temperature of the room return air at return air sensor 214 (db RA) and db OA>P1, control module 206 is in Mode W at 616 where CRACs 116 of climate control systems 202, 204 operate to provide cooling air and outside air damper 216 is also opened. FC=100%−A %, where A % is the % operation of CRACs 116. In this case, the dry bulb temperature the outside ambient air is less than the dry bulb temperature of the room return air, but greater than the dry bulb temperature set point. Outdoor air is used in conjunction with CRACs 116 unit to provide supply air at the requisite temperature to cool the data center 200, and the free cooling percentage is based on the percent usage of the cooling unit capacity. (For example, if the cooling unit has a capacity modulated compressor and the capacity modulated compressor is on 60%, the free cooling is 40%. If the cooling unit uses cooling water and the cooling water (CW) valve is 60% open, the free cooling is 40%.)

The climate control systems 202, 202 may also have a user-selectable lockout mode. During lockout mode, the outside air damper 216 of the air economizer 204 is closed and the CRACs provide all of the cooling.

In an aspect, control module 206 operates CRACs 116 to control humidity of data center 200 only during Mode Y.

In an aspect, the speed of the blower/fan of air moving unit 119, 121 may be controlled as follows in certain of the above modes, such as by setting the appropriate frequency of variable speed drive 228. In Modes Y & Z, blower/fan speed is set equal to the percent usage of CRAC(s) 116 (minimum of 60%). For example if the capacity modulation is 70% (for a CRAC having a capacity modulated compressor) or the CW valve is 70% open (for a CRAC having a CW), then the blower/fan speed is set equal to 70%.

In modes X & W, assuming that air moving unit 119, 121 has a variable frequency drive, control module 206 begins operating the variable frequency drive at 2 Hz above the frequency at which it operated variable frequency drive 702 in the last Mode Y or Mode Z operation. If the dry bulb temperature of the room return air (db RA) increases by more than a predetermined amount, such as 5° F., from the last reading when in the Mode Y or Mode Z operation, control module 206 returns to the air economizer lock out mode where air economizer 204 is closed for a predetermined time period, such as fifteen minutes. (Top speed is retained as the default 50 or 60 Hz of the variable frequency drive).

Figure 7:
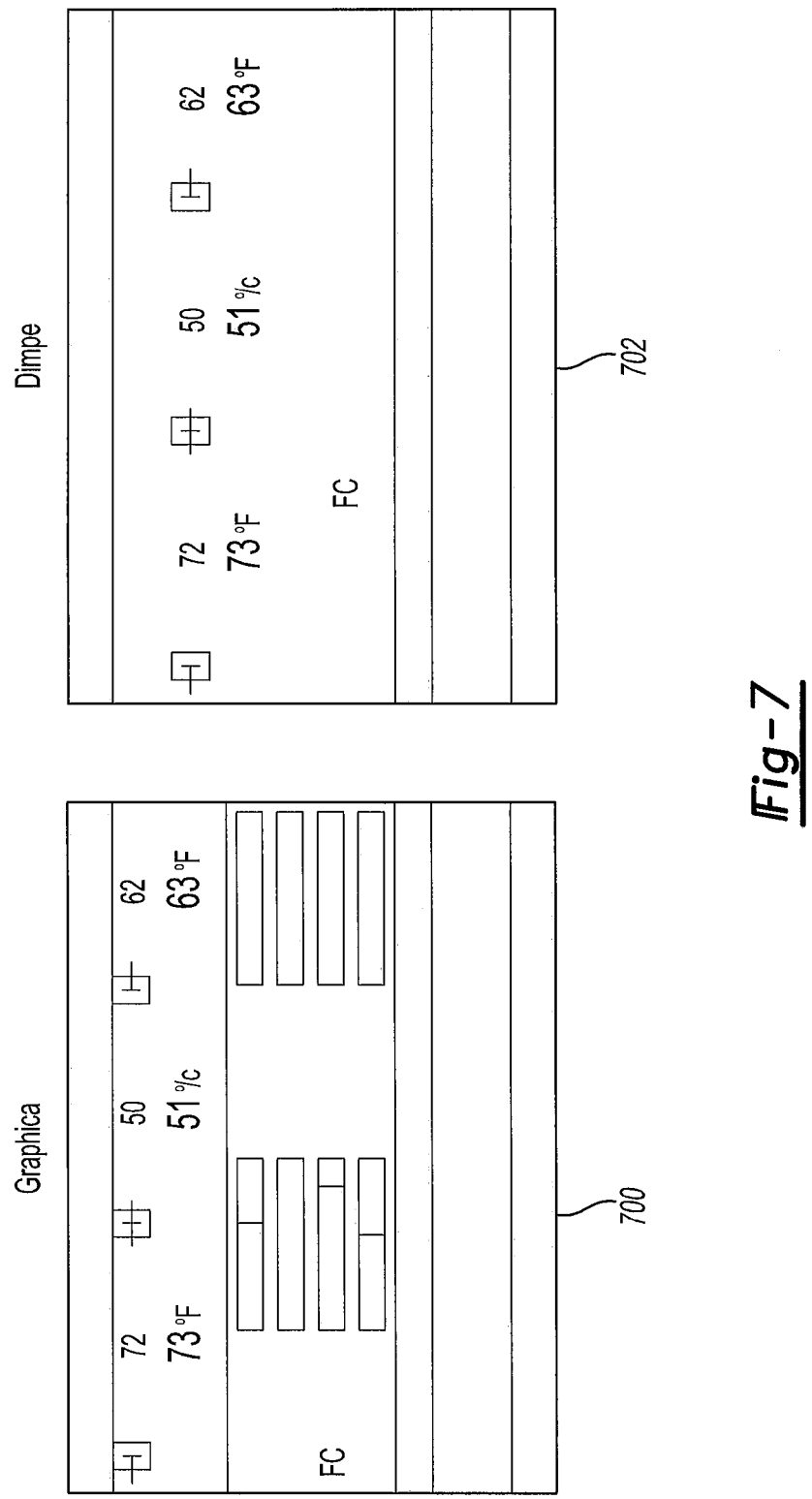
FIG. 7 shows displays of the climate control systems of FIGS. 2A and 2B.

In addition, the control module 206 may utilize sensor inputs and setpoints to diagnose alarm conditions and activate alarms. The alarms may be activated, by way of example and not of limitation, by displaying alarm information on display 700 or 702 (FIG. 7). The alarms may also include audible and/or visual alarms. For example, if db OA<P1, but the dry bulb temperature of the supply air at supply air sensor 208 (db SA) cannot attain P1 within a predetermined timeout period, outside air damper 216 may be closed and an alarm activated that the "outside air damper 216 is not operating effectively." In this case, the dry bulb temperature of the outside ambient air (db OA) appears to be lower than the setpoint temperature P1, but the room return air is unable to bring the data center temperature to the setpoint P1. This indicates that the cooler outside air is not being transferred to the data center 200 properly.

If in Mode Y or Z control module 206 determines that the dew point of the outside air (dp OA) is not equal to the dew point of the supply air (dp SA)±P4, it activates an alarm that indicates that outside air damper 216 is not working effectively." In this case, it is likely that the outside air is contributing to the temperature provided by the climate control system 202, 204 diverging from the temperature at the return air damper 210 by more than then threshold P4.

If in Mode X and control module 206 determines that the dry bulb temperature of the supply air (db SA) is not equal to the dry bulb set point P1±P4, control module 206 activates an alarm that indicates that the return air damper 210 is not operating effectively. In this case the temperature of the supply air is not within a predetermined threshold P4 of the desired setpoint temperature P1. This provides a good indication that the return air damper 210 is not operating properly.

The climate control system may also be provided with a display as depicted in FIG. 7. The return air and supply air dry bulb temperatures (db R, db SA) may be displayed. Relative humidity may also be calculated and displayed. The actual number to be displayed is the relative humidity percentage at the average temperature of db RA and db OA when the dew-point is the average of db RA and db OA. The value to display for the set-point RH % at 72.5° F. when the dew-point is the average of P2 and P3. Free cooling may also be displayed such as by a numeric display.

Figure 8:
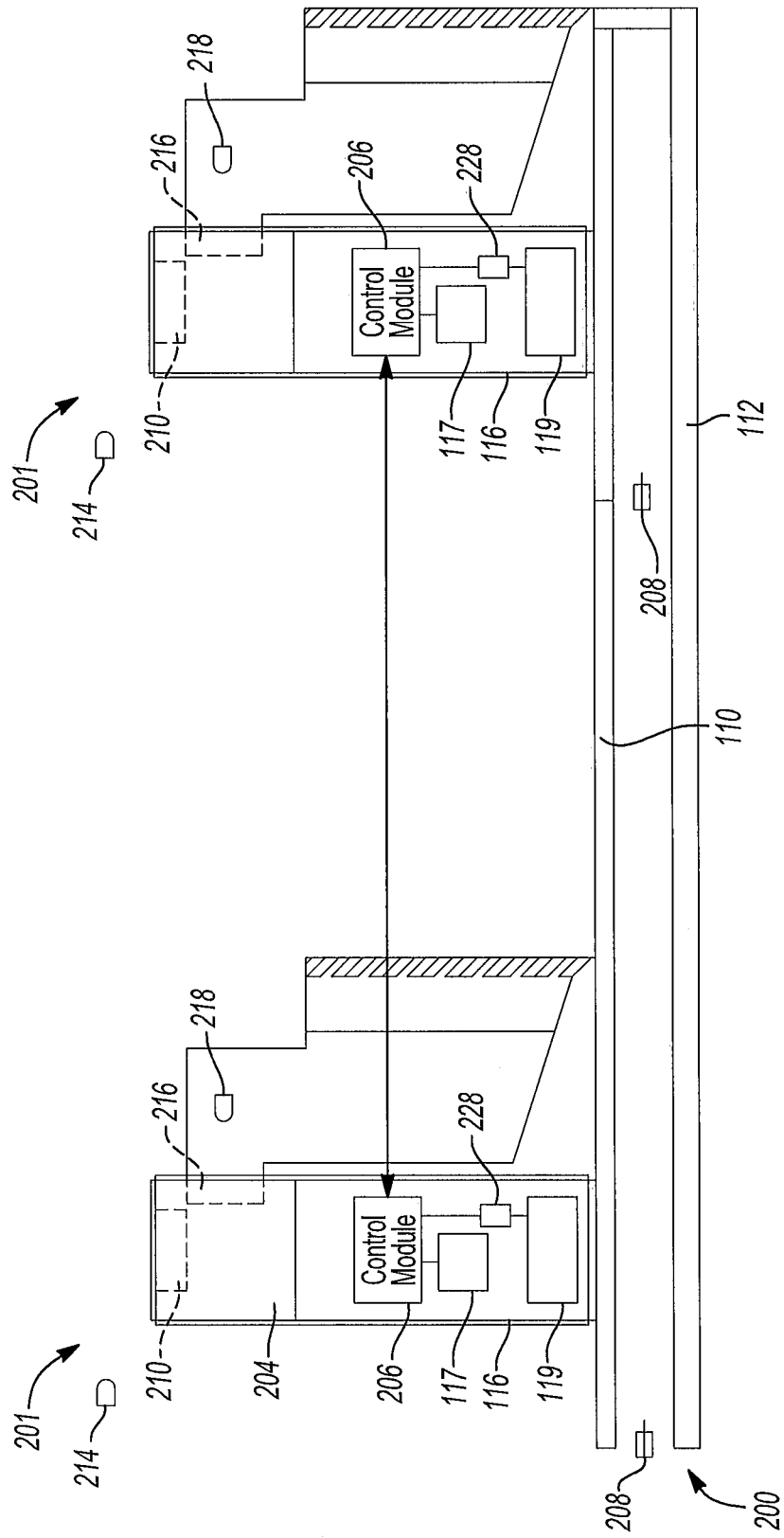
FIG. 8 is a schematic illustrating a plurality of climate control systems of FIG. 2A having their control modules teamed together.

The climate control systems 201, 202 may also be operated with a plurality of systems 201, 202 providing climate control to a single data center room or location. With reference to FIG. 8, a plurality of systems 201 may operate in a "teamwork" mode. (It should be understood that the plurality of systems can alternatively have systems 202 or additionally have systems 202.) Individual temperature and humidity readings from the respective sensors at each system 201 may not be exactly the same. Absent some sort of teamwork, these divergent conditions might cause the respective systems 201 to operate against each other. This may use more energy and further exacerbate any temperature or humidity differences as sensed by any one unit.

In an example embodiment, each set of the respective supply air sensors $208_1$-$208_N$ of plurality of systems 201, outdoor ambient air sensors $218_1$-$218_N$, and return air sensors $214_1$-$214_N$, may have their values averaged to determine average values $SA_{AVG}$, $OA_{AVG}$, and $RA_{AVG}$. The individual climate control systems 201 may then operate based on the average values. Teamwork may also be used when an emergency mode occurs to assist in supplying the cooling function that would normally be provided by the system operating in emergency mode. In this regard, each control module 206 operates its respective climate control system 201 based in part on how the other climate control systems 201 are operating. For example, if one of the climate control systems 201 is using outside air to cool data center 200, then the control modules for all the climate control systems 201 may shut off humidity control.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings and the specification.

What is claimed is:

1. In a data center having equipment racks in which electronic equipment is disposed and a climate control system that includes a computer room air conditioner (CRAC) and an air economizer, the climate control system including a control module, a method of controlling the climate control system, comprising:

measuring a dry bulb temperature of outside air and a parameter indicative of humidity of the outside air and storing the measurements in the control module;

controlling a return air damper and an outside air damper of the air economizer with the control module;

determining with the control module whether the outside air is suitable for use in cooling the data center based on the dry bulb temperature and the humidity of the outside air;

controlling the climate control system with the control module to use only the CRAC to cool the data center when the control module determines that the outside air is not suitable for cooling the data center;

when the control module determines that the outside air is suitable for use in cooling the data center, determining with the control module to use outside air and not the CRAC to cool the data center when the dry bulb temperature of the outside air is below a minimum outside air dry bulb temperature set point, and the control module controlling the climate control system as needed to mix a sufficient quantity of the return air with the outside air to heat the outside air before the mixed return air and outside air is introduced as supply air into the data center, so that the supply air is above a minimum temperature;

when the control module determines that outside air is suitable for use in cooling the data center and the dry bulb temperature of the outside air is above the minimum outside air dry bulb temperature set point, determining with the control module a cooling percentage of cooling of the data center to be provided by the CRAC and a cooling percentage to be provided by the outside air, where the percentage can range from zero percent to one-hundred percent, and controlling the climate control system with the control module so that the CRAC and the outside air provide cooling of the data center according to their respective determined cooling percentages;

further controlling the climate control system with the control module based on user adjustments limiting or expanding use of the air economizer, and thus use of the outside air in cooling the data center, allowing the user to set compromises between energy savings and projected life of electronic equipment in the data center; and using the control module to operate a heat rejection device at a load corresponding to the cooling percentage of the data center being provided by the CRAC.

2. The method of claim 1 including controlling the climate control system with the cooling module to shut off any humidity control when the outside air is being used to cool the data center.

3. The method of claim 1 wherein determining with the control module that the outside air is suitable for use in cooling the data center includes determining that the outside air is suitable for use in cooling the data center when the control module determines that the humidity of the outside air is above a minimum humidity.

4. The method of claim 1 wherein determining with the control module that the humidity of the outside air is above a minimum humidity includes determining with the control module that the outside air is above the minimum humidity when the control module determines that a dew point of the outside air is above a minimum outside air dew point set point.

5. The method of claim 1 wherein determining with the control module the cooling percentages for the CRAC and outside air includes determining with the control module a heat load of the data center and determining the cooling percentages based on the heat load.

6. The method of claim 5 including determining with the control module a rate at which to run an air moving unit of the climate control system based on the heat load.

7. The method of claim 6 wherein determining with the control module the rate at which to run the air moving unit based on the heat load includes determining to run the air moving unit at a high air flow rate if the heat load is high, a moderate air flow rate if the heat load is moderate, and a low air flow rate if the heat load is low.

8. The method of claim 1 wherein determining with the control module the cooling percentages of the CRAC and outside air includes maximizing the cooling percentage of the outside air and minimizing the cooling percentage of the CRAC.

9. The method of claim 1 wherein controlling the climate control system with the control module includes activating an alarm with the control module when the control module determines that either the return air damper or the outside air damper is not operating properly.

10. The method of claim 1 including measuring a dry bulb temperature of room return air and wherein determining with the control module whether the outside air is suitable for use in cooling the data center includes determining that the outside air is suitable for use in cooling the data center when the dry bulb temperature of the outside air is less than the dry bulb temperature of the room return air.

11. The method of claim 1 wherein:
the data center includes a plurality of climate control systems; and
controlling each one of the climate control systems with its respective control module includes teaming the control modules with each; and
controlling each said climate control system with its respective said control module includes determining, with the control module of each said climate control system, how to control its associated said climate control system based on how the control module of each other one of the climate control systems is controlling its associated said climate control system.

12. The method of claim 1 wherein the climate control system includes a fluid economizer having a cooling coil disposed in the computer room air conditioner, the method including staging with the control module the air economizer, the fluid economizer and the computer room air conditioner in the order of the air economizer, the fluid economizer and the computer room air conditioner.

13. In a data center having equipment racks in which electronic equipment is disposed, a climate control system comprising:
a computer room air conditioner (CRAC), an air economizer and a control module coupled to the CRAC and air economizer, the air economizer having a return air damper and an outside air damper;
an outside air sensor that senses dry bulb temperature and a parameter indicative of humidity of the outside air, the outside air sensor coupled to the control module;
a return air sensor that senses dry bulb temperature and a parameter indicative of humidity of the return air, the return air sensor coupled to the control module;
a supply air sensor that senses dry bulb temperature of supply air coupled to the control module;
the control module controlling the return air damper and the outside air damper of the air economizer;
the control module determining whether the outside air is suitable for use in cooling the data center based on the dry bulb temperature and the parameter indicative of humidity of the outside air, and controls the climate control system to use only the CRAC to cool the data center when the control module determines that the outside air is not suitable for cooling the data center;
when the control module determines that the outside air is suitable for use in cooling the data center, the control modules determines to use the outside air and not the CRAC to cool the data center when the dry bulb temperature of the outside air is below a first minimum outside air dry bulb temperature set point and the control module controlling the climate control system to heat the outside air by mixing the outside air with the return air, before the mixed return and outside air is introduced as supply air into the data center so that the supply air is above a minimum temperature;
when the control module determines that the outside air is suitable for use in cooling the data center and the dry bulb temperature of the outside air is above the second minimum outside air dry bulb temperature set point, the control module determines a cooling percentage of cooling of the data center to be provided by the CRAC and a cooling percentage to be provided by the outside air, where the percentage can range from zero percent to one-hundred percent, the control module then controlling the climate control system so that the CRAC and the outside air provide cooling of the data center according to their respective determined cooling percentages;
the control module also controlling the climate control system based on user adjustments limiting or expanding use of the air economizer and thus use of the outside air in cooling the data center allowing the user to set compromises between energy savings and projected life of electronic equipment in the data center; and
wherein the control module in determining the cooling percentages of the CRAC and outside air maximizes the cooling percentage of the outside air and minimizes the cooling percentage of the CRAC, the control module controlling a heat rejection device to operate at a load corresponding to the cooling percentage of the CRAC.

14. The system of claim 13 wherein the control module shuts off any humidity control when the outside air is being used to cool the data center.

15. The system of claim 13 wherein when the outside air temperature is below the minimum outside air dry bulb temperature setpoint, the control module controls the climate control system to condition the outside air so that the supply air is above the minimum temperature by controlling the return air and outside air dampers to mix the return air with the outside air.

16. The system of claim 13 wherein the control module determines that the outside air is suitable for use in cooling the data center when the humidity of the outside air is above a minimum humidity.

17. The system of claim 13 wherein the control module determines that that the humidity of the outside air is above a minimum humidity when the control module determines that a dew point of the outside air is above a minimum outside air dew point set point.

18. The of claim 13 wherein the control module determines a heat load of the data center and determines the cooling percentages for the CRAC and the outside air based on the heat load.

19. The system of claim 17 wherein the control module determines a rate at which to run an air moving unit of the climate control system based on the heat load.

20. The system of claim 18 wherein determining with the control module determines to run the air moving unit at a high air flow rate if the heat load is high, a moderate air flow rate if the heat load is moderate, and a low air flow rate if the heat load is low.

21. The system of claim 13 wherein the control module activating an alarm when the control module determines that either the return air damper or the outside air damper is not operating properly.

22. The system of claim 13 wherein the control module determines whether the outside air is suitable for use in cooling the data center when the dry bulb temperature of the outside air is less than the dry bulb temperature of the room return air.

23. The system of claim 13 wherein the data center includes a plurality of climate control systems teamed together with their control modules coupled to each other, each said control module controlling its associated said climate control system based in part on how the control module of each other one of the climate control systems is controlling its associated said climate control system.

24. The system of claim 13 wherein the return air sensor and the outside air sensor each include a combined sensor that senses both dry bulb temperature and the parameter indicative of humidity.

25. The system of claim 13 wherein the return air sensor and the outside air sensor each include separate sensors, one of the sensors sensing dry bulb temperature and the other sensor sensing the parameter indicative of humidity.

26. The system of claim 13 wherein the climate control system includes a fluid economizer having a cooling coil disposed in the computer room air conditioner, the control module staging the air economizer, the fluid economizer and the computer room air conditioner in the order of the air economizer, the fluid economizer and the computer room air conditioner.

27. The method of claim 1 including controlling the climate control system with the control module based on a plurality of setpoints that are user programmable to provide adaptive control and allow for changing of the way in which the climate control system is controlled over a life of the data center.

28. The system of claim 13 wherein the control module controls the climate control system based on a plurality of setpoints that are user programmable to provide adaptive control and allows for changing of the way in which the climate control system is controlled over a life of the data center.

* * * * *